(12) United States Patent
Bollman et al.

(10) Patent No.: US 7,829,143 B1
(45) Date of Patent: Nov. 9, 2010

(54) SOLVENT VAPOR ANNEALING OF ORGANIC FILMS

(75) Inventors: Brent J. Bollman, Belmont, CA (US); Matthew R. Robinson, San Francisco, CA (US)

(73) Assignee: Nanosolar, Inc., San Jose, CA (US)

( * ) Notice: Subject to any disclaimer, the term of this patent is extended or adjusted under 35 U.S.C. 154(b) by 1131 days.

(21) Appl. No.: 10/719,040

(22) Filed: Nov. 21, 2003

(51) Int. Cl.
*C23C 16/00* (2006.01)
*B05D 3/04* (2006.01)
*B05D 3/10* (2006.01)

(52) U.S. Cl. .................................. 427/248.1; 427/335
(58) Field of Classification Search .................. None
See application file for complete search history.

(56) References Cited

U.S. PATENT DOCUMENTS

| 1,141,221 | A | * | 6/1915 | Wawrzinick | ................ 234/20 |
| 4,122,223 | A | * | 10/1978 | Civardi et al. | ................ 428/91 |
| 4,247,580 | A | * | 1/1981 | Chao | ................ 427/140 |
| 4,293,596 | A | * | 10/1981 | Furendal et al. | ................ 427/160 |

* cited by examiner

*Primary Examiner*—Timothy Meeks
*Assistant Examiner*—Kelly M Gambetta

(57) ABSTRACT

Organic films can be annealed by exposure to a solvent vapor. The solvent vapor annealing renders the organic film insoluble even in a solvent of a solution from which it was deposited. This enables deposition of two or more organic films in sequence without having one deposition alter an underlying organic film. Devices can be easily fabricated with organic films annealed in this manner when no other solution processing method is possible.

24 Claims, 1 Drawing Sheet

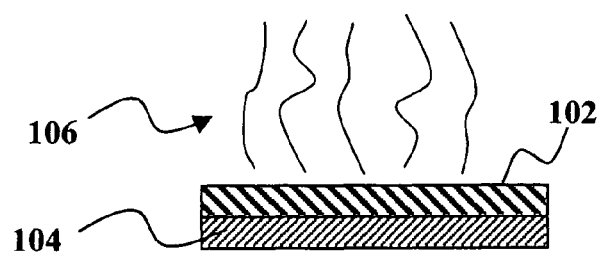
FIG. 1
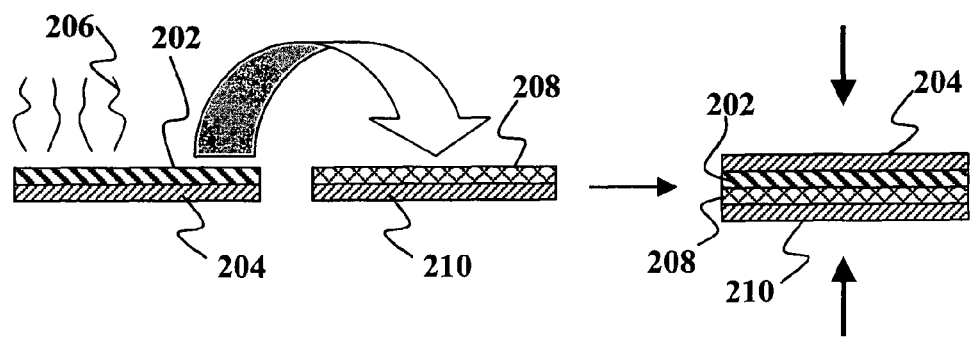
FIG. 2A          FIG. 2B

SOLVENT VAPOR ANNEALING OF ORGANIC FILMS

CROSS-REFERENCE TO RELATED APPLICATION

This application is related to commonly-assigned, co-pending application Ser. No. 10/719,041, filed Nov. 21, 2003, the entire disclosures of which are incorporated herein by reference.

FIELD OF THE INVENTION

The present invention relates to polymer processing and more particularly to annealing polymer films to make them insoluble in a solvent.

BACKGROUND OF THE INVENTION

Conjugated polymer films have applications in photovoltaic devices such as solar cells. Conjugated polymer films, like films of other polymers are typically fabricated from a solution containing a conjugated polymer material dissolved in a solvent. The solution is spread onto a substrate in a thin layer and the solvent is allowed to evaporate leaving behind the conjugated polymer material.

It is often desirable to fabricate an organic bi-layer photovoltaic device using two or more different conjugated polymer films in adjacent layers. In principle, a first conjugated polymer film would be formed on a substrate using a first solution. Then a second film would be formed on the first using a second solution. Unfortunately, it is often the case that the solvent used in the second solution tends to dissolve the first conjugated polymer film.

Presently, there are only two methods for making organic bi-layer photovoltaic device. The first method uses evaporation deposition of one or more of the conjugated polymers. Unfortunately, this is a more costly and complicated procedure. The second method is to deposit a second film using a solvent that does not disrupt the first film but still dissolves the second precursor while wetting the first film. Unfortunately, it is extremely difficult to find a solvent that will wet an organic film without dissolving it.

Thus, there is a need in the art, for a method of immobilizing an organic film so that subsequent exposure to a solvent will not disrupt the film.

BRIEF DESCRIPTION OF THE DRAWINGS

The teachings of the present invention can be readily understood by considering the following detailed description in conjunction with the accompanying drawings, in which:

FIG. 1 is a cross-sectional schematic diagram illustrating solvent vapor annealing according to an embodiment of the present invention.

FIGS. 2A-2B are cross sectional schematic diagrams illustrating fabrication of a two-layer device according to an embodiment of the present invention.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. Organic electronic devices, including, but not limited to photovoltaic devices, organic light emitting devices (OLEDs), transistors using organic gate dielectrics and active layers can be easily fabricated using this technique when no other solution processing method is available.

According to embodiments of the present invention, organic films deposited from solution can be annealed by exposure to a solvent vapor. The solvent vapor annealing renders the organic film insoluble even in the solvent of the solution from which it was deposited. This enables deposition of two or more organic films in sequence without having one deposition alter an underlying organic film.

FIG. 1 illustrates solvent vapor annealing according to an embodiment of the present invention. An organic film 102, which has been formed on a substrate 104, is exposed to a solvent vapor 106. Exposing the organic film 102 to the solvent vapor 106 rearranges the organic film 102 in such a manner that the organic film 102 is rendered insoluble even if the organic film 102 was cast from a solution containing the same solvent as the solvent vapor 106.

The organic film 102 can be any organic material, i.e., any material having carbon as its principle constituent. For example, the organic film 102 can be a film of a small-molecule material, e.g., a pigment, dye (e.g. perylene), $C_{60}$ and/or derivatives thereof, such as PCBM and pentacene or pentacene precursors. More preferably, organic film 102 can be made of a polymer material. Such a polymer material can be an insulating polymer such as poly(ethylene terephthalate) (PET, also known as Mylar) and poly(ethylene 2,6-naphthalate).

Most preferably, the organic material includes one or more conducting polymers such as poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5-diyl), regioregular, poly(3-octylthiophene-2,5-diyl), regiorandom, poly(3-hexylthiophene) (P3HT), poly(3-hexylthiophene-2, 5-diyl), regioregular, poly(3-hexylthiophene-2,5-diyl), regiorandom), poly(thienylenevinylene) and derivatives thereof, and poly(isothianaphthene) and derivatives thereof, tetra-hydro-thiophene precursors and derivatives thereof, poly-phenylene-vinylene and derivatives organometallic polymers, polymers containing perylene units, poly (squaraines) and their derivatives, discotic liquid crystals polyfluorenes, polyfluorene copolymers, polyfluorene-based copolymers and blends, e.g. co-polymerized and/or blended with materials such as charge transporting (e.g. tri-phenyl-amines and derivatives) and/or light-absorbing compounds (e.g. fused thiophene rings and derivatives, generally heteroatom ring compounds with or without substituents). Those of skill in the art will be familiar with suitable solvents capable of dissolving these polymers.

In principle the substrate 104 can be any material suitable as a platform for solution deposition of the organic film 102. In particular embodiments of the present invention, the substrate 104 is a nanostructured material having numerous pores, channels, cavities, or tubes with diameters between about 1 nm and about 100 nm, with a pore density between about $10^{12}$ pores per square meter and about $10^{16}$ pores per square meter. Examples of such materials are described e.g., in commonly assigned U.S. patent application Ser. Nos. 10/319,406 and 10/443,456 the disclosures of both of which are incorporated herein by reference. Solvent vapor annealing is particularly useful for fabrication of devices where the organic film 102 infiltrates the pores in the nanostructured material.

Exposing the organic film 102 to the solvent vapor 106 anneals the organic film 102 without having to heat it. The organic film 102 can be exposed to the solvent vapor 106 by any suitable technique such as a flow tube or solvent vapor filled chamber. The exposure time needed to anneal the organic film 102 typically ranges from several minutes to several hours. The solvent vapor 106 can be a vapor of any suitable organic or inorganic solvent. Examples of suitable organic solvents include acetone, chloroform, benzene, cyclohexane, dichloromethane, ethanol, diethyl ether, ethyl acetate, hexane, methanol, toluene, xylene, mixtures of two or more of these, and derivatives of one or more of these. Although organic solvents are more preferred, some organic materials are soluble in inorganic solvents such as water ($H_2O$).

Although it is counterintuitive to expect that exposing an organic material to a vapor of a solvent would render that organic material insoluble in that solvent, the inventors have demonstrated this result experimentally. By way of example, a P3HT film was placed on a substrate by spin coating a solution of $CHCl_3$ and P3HT onto the substrate. After allowing the solvent to evaporate, the P3HT was annealed by exposing it to $CHCl_3$ vapor. After exposing the film to $CHCl_3$ vapor for several minutes to several hours, subsequent rinsing with $CHCl_3$, even in copious amounts, did not dissolve the P3HT film. By contrast, similarly prepared P3HT films that were not annealed by exposure to solvent vapor dissolved in $CHCl_3$. Thus, the solvent vapor annealing rendered at least the top portion of the P3HT film insoluble in the solvent from which it was cast.

Other embodiments of the present invention can be applied to lamination or layer-transfer as depicted in FIGS. 2A-2B. As shown in FIG. 2A, first organic film 202 on a suitable substrate 204 can be annealed by exposure to a solvent vapor 206. The first organic film may be formed by deposition from a solution and evaporation of solvent from the solution. A second organic film 208, which is still wet, can be prepared on a second substrate 210. While the second organic film 208 is still wet, the first and second substrates 204, 210 can be brought into close proximity to each other as shown in FIG. 2B such that the first and second organic films 202, 208 are disposed between the first and second substrates 204, 210. The two substrates 204, 210 can be pressed together and then allowed to dry.

Alternatively the first and second organic films 202, 208 could both pressed together after solvent evaporation and then solvent vapor annealed to lock them into a stable configuration.

Embodiments of the present invention will be extremely useful in industries such as the solar cell industry and the organic LED industry where devices make use of tri-layer or multilayer architectures for hole transport, electron transport, and recombination/emitting layers.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A method for annealing an organic film, comprising:
   exposing the organic film to a vapor of a solvent for a period of time sufficient to render at least an outermost portion of the organic film insoluble in the solvent, wherein insolubility of the outermost portion results only from exposure of the organic film to the vapor of the solvent;
   wherein without exposure to the vapor of the solvent, the organic film is dissolvable by the solvent.

2. The method of claim 1 wherein the organic film includes a small-molecule material, dye, pigment, pentacene or pentacene precursor, $C_{60}$ and/or derivatives thereof, PCBM or polymer.

3. The method of claim 2 wherein the organic film includes a polymer material.

4. The method of claim 3 wherein the polymer material is an insulating polymer.

5. The method of claim 4 wherein the insulating polymer is poly(ethylene terephthalate) (PET) and poly(ethylene 2,6-naphthalate).

6. The method of claim 3 wherein the polymer material is an electrically conducting or semiconducting polymer.

7. The method of claim 6 wherein the polymer material includes a material from the group of poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5-diyl), regioregular, poly(3-octylthiophene-2,5-diyl), regiorandom, poly(3-hexylthiophene) (P3HT), poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof, tetra-hydro-thiophene precursors and derivatives thereof, poly-phenylene-vinylene and derivatives organometallic polymers, polymers containing perylene units, poly(squaraines) and their derivatives, discotic liquid crystals polyfluorenes, polyfluorene copolymers, polyfluorene-based copolymers and blends, e.g. co-polymerized and/or blended with materials such as charge transporting (e.g. tri-phenyl-amines and derivatives) and/or light-absorbing compounds (e.g. fused thiophene rings and derivatives, generally hetero-atom ring compounds with or without substituents).

8. The method of claim 1 wherein the solvent is an organic solvent.

9. The method of claim 8 wherein the organic solvent is selected from the group of acetone, chloroform, benzene, cyclohexane, dichloromethane, ethanol, diethyl ether, ethyl acetate, hexane, methanol, toluene, xylene, mixtures of two or more of these, and derivatives of one or more of these.

10. The method of claim 1 wherein insolubility of the outermost portion results directly from exposure of the organic film to the vapor of the solvent without heat treating the organic film.

11. A method for forming an organic film, comprising:
    placing a solution containing an organic material and a first solvent on a substrate;
    evaporating the first solvent from the solution leaving an organic film on the substrate;
    annealing the organic film by exposing it to a vapor of a second solvent for a period of time sufficient to render at least an outermost portion of the organic film insoluble in the first solvent,
    wherein without exposure to the vapor of the second solvent, the organic film is dissolvable by the first solvent;
    wherein the first solvent and second solvent are the same solvent.

12. The method of claim 11 wherein the organic material includes a pigment, small-molecule material, dye, pentacene or pentacene precursor, $C_{60}$ and/or derivatives thereof, PCBM or polymer.

13. The method of claim 12 wherein the organic material is an insulating polymer.

14. The method of claim 13 wherein the insulating polymer is poly(ethylene terephthalate) (PET) and poly(ethylene 2,6-naphthalate).

15. The method of claim 11 wherein the organic material is a conducting polymer from the group of poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5-diyl), regioregular, poly(3-octylthiophene-2,5-diyl), regiorandom, poly(3-hexylthiophene) (P3HT), poly(3-hexylthiophene-2, 5-diyl), regioregular, poly(3-hexylthiophene-2,5-diyl), regiorandom), poly(thienylenevinylene) and derivatives thereof, and poly(isothianaphthene) and derivatives thereof, tetra-hydro-thiophene precursors and derivatives thereof, poly-phenylene-vinylene and derivatives organometallic polymers, polymers containing perylene units, poly(squaraines) and their derivatives, discotic liquid crystals polyfluorenes, polyfluorene copolymers, polyfluorene-based copolymers and blends, e.g. co-polymerized and/or blended with materials such as charge transporting (e.g. tri-phenyl-amines and derivatives) and/or light-absorbing compounds (e.g. fused thiophene rings and derivatives, generally hetero-atom ring compounds with or without substituents).

16. The method of claim 11 wherein the first or second solvent is an organic solvent.

17. The method of claim 16 wherein the first solvent is selected from the group of is selected from the group of acetone, chloroform, benzene, cyclohexane, dichloromethane, ethanol, diethyl ether, ethyl acetate, hexane, methanol, toluene, xylene, mixtures of two or more of these, and derivatives of one or more of these.

18. The method of claim 16 wherein the first and second solvents are both chloroform (CHCl3).

19. The method of claim 11 wherein insolubility of the outermost portion results directly from vapor annealing.

20. The method of claim 11 wherein insolubility of the outermost portion results directly from vapor annealing without heat treating the organic film.

21. A method for making a device, comprising:
placing a first solution containing a first organic material and a first solvent on a first substrate;
evaporating the first solvent from the first solution leaving a film of the first organic material on the substrate;
annealing the first film of the first organic material by exposing it to a vapor of a second solvent for a period of time sufficient to render at least an outermost portion of the film of the first organic material insoluble in the first or second solvent;
placing a second solution containing a second organic material and a second solvent on a second substrate;
disposing the first and second substrates in proximity to each other with the film of the first organic material and the second solution disposed between the first and second substrates;
wherein the first substrate is a nanostructured material having pores, channels, cavities, or tubes with diameters between about 1 nm and about 100 nm, with a pore density between about $10^{12}$ pores per square meter and about $10^{16}$ pores per square meter.

22. The method of claim 21, further comprising pressing the first and second substrates together.

23. The method of claim 21 wherein annealing the film of the first organic material by exposing it to a vapor of a second solvent occurs after the first and second substrates have been pressed together.

24. The method of claim 21 wherein the first organic material infiltrates the pores, channels, cavities, or tubes in the nanostructured material.

* * * * *